United States Patent
Chai

(10) Patent No.: US 11,581,028 B2
(45) Date of Patent: Feb. 14, 2023

(54) MEMORY DEVICE FOR COUNTING FAIL BITS INCLUDED IN SENSED DATA

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 17/395,352

(22) Filed: Aug. 5, 2021

(65) Prior Publication Data

US 2022/0262411 A1    Aug. 18, 2022

(30) Foreign Application Priority Data

Feb. 18, 2021 (KR) .................. 10-2021-0022120

(51) Int. Cl.
*G11C 7/02* (2006.01)
*G11C 7/10* (2006.01)
*G11C 7/14* (2006.01)
*G11C 7/12* (2006.01)

(52) U.S. Cl.
CPC .......... *G11C 7/1039* (2013.01); *G11C 7/1069* (2013.01); *G11C 7/1096* (2013.01); *G11C 7/12* (2013.01); *G11C 7/14* (2013.01)

(58) Field of Classification Search
CPC ....................................................... G11C 7/14
USPC ....................................................... 365/210.1
See application file for complete search history.

(56) References Cited

U.S. PATENT DOCUMENTS

2018/0350440 A1* 12/2018 Jang .................. G11C 16/3459

FOREIGN PATENT DOCUMENTS

KR    10-2016-0140506 A    12/2016
KR    10-2019-0018323 A    2/2019

* cited by examiner

*Primary Examiner* — Hoai V Ho
(74) *Attorney, Agent, or Firm* — IP & T Group LLP

(57) ABSTRACT

The present technology includes a memory device. The memory device includes memory cells, page buffers configured to store sensed data obtained from the memory cells, a current sensing circuit configured to compare a sensed voltage generated according to the sensed data and a reference voltage generated according to an allowable fail bit code, and output a pass signal or a fail signal according to a comparison result, and a fail bit manager configured to increase an allowable number of fail bits included in the allowable fail bit code until the pass signal is output from the current sensing circuit, change the allowable fail bit code according to the allowable number of fail bits, and provide the allowable fail bit code to the current sensing circuit.

20 Claims, 11 Drawing Sheets

MEMORY DEVICE FOR COUNTING FAIL BITS INCLUDED IN SENSED DATA

CROSS-REFERENCE TO RELATED APPLICATION

The present application claims priority under 35 U.S.C. § 119(a) to Korean patent application number 10-2021-0022120 filed on Feb. 18, 2021, the entire disclosure of which is incorporated by reference herein.

BACKGROUND

1. Field of Invention

The present disclosure relates to a memory device, and more particularly, to a memory device capable of counting a fail bit.

2. Description of Related Art

A memory system may include a memory device in which data is stored and a controller capable of controlling the memory device. The memory device is classified into a volatile memory device and a non-volatile memory device. Since the volatile memory devices have different characteristics, the volatile memory devices are used in an electronic device according to each function. For example, the volatile memory device has a characteristic in which a speed of a program operation and a read operation is faster than that of the non-volatile memory device, but, stored data is destroyed when supply of power is stopped. The non-volatile memory device has a characteristic in which a speed of the program operation and the read operation is slower than that of the volatile memory device, but stored data is maintained even though supply of power is stopped. In addition, since the non-volatile memory device may have an integration degree higher than that of the volatile memory device, the non-volatile memory device may store large amounts of data.

The memory device may include a memory cell array in which data is stored, a peripheral circuit configured to program, read, or erase memory cells included in the memory cell array, and a control logic circuit capable of controlling the peripheral circuit.

The memory cell array may include a plurality of memory blocks, and each of the plurality of memory blocks may include a plurality of memory cells. A method of storing one bit of data in one memory cell is referred to as a single level cell (SLC) method, and a method of storing two or more bits of data is referred to as a multi-level cell (MLC) method. The MLC method may be classified into a triple level cell (TLC) method or a quadruple level cell (QLC) method according to the number of bits stored in the memory cell. In the TLC method, three bits of data may be stored in one memory cell, and in the QLC method, four bits of data may be stored in one memory cell.

The peripheral circuit may include a row decoder connected to the plurality of memory cells through word lines and a page buffer group connected to the plurality of memory cells through bit lines. A program voltage, a read voltage, a verify voltage, or a pass voltage may be applied to the memory cells through the word lines, and data of the memory cells may be sensed through the bit lines.

SUMMARY

An embodiment of the present disclosure provides a memory device capable of reducing a size of a circuit capable of counting a fail bit during a read operation and improving a speed of the read operation.

According to an embodiment of the present disclosure, a memory device includes memory cells, page buffers configured to store sensed data obtained from the memory cells, a current sensing circuit configured to compare a sensed voltage generated according to the sensed data and a reference voltage generated according to an allowable fail bit code, and output a pass signal or a fail signal according to a comparison result, and a fail bit manager configured to increase an allowable number of fail bits included in the allowable fail bit code until the pass signal is output from the current sensing circuit, change the allowable fail bit code according to the allowable number of fail bits, and provide the allowable fail bit code to the current sensing circuit.

According to an embodiment of the present disclosure, a memory device includes memory cells, page buffers connected to the memory cells through bit lines and configured to sense a current or a voltage of the bit lines during a read operation to store sensed data, a current sensing circuit configured to determine whether the read operation is passed or failed according to a number of fail bits detected in the sensed data and an allowable number of fail bits, and change a ratio of the number of the detected fail bits and the number of the allowable fail bits corresponding to the number of detected fail bits, wherein the ratio is determined according to the compensation value number, and a fail bit manager configured to adjust the allowable number of fail bits until the read operation is passed, and adjust the number of the compensation values when it is determined that the read operation is failed until the allowable number of fail bits reaches a maximum value.

According to an embodiment of the present disclosure, a method for operating a memory device, includes determining whether a read operation has failed by comparing a sensed voltage with a reference voltage, when it is determined that the read operation has failed, adjusting the reference voltage and repeating the determining based on the adjusted reference voltage until the reference voltage has been adjusted to a set maximum reference voltage, and when it is determined that the read operation has failed although the reference voltage has been adjusted to the maximum reference voltage, adjusting a criterion based on which read operation is determined as successful or failed and repeating the determining based on the adjusted criterion, wherein the sensed voltage corresponds to a number of fail bits detected within data sensed from a group of memory cells in the memory device, wherein the reference voltage corresponds to an allowable number of fail bits, wherein the criterion is adjusted according to a compensation code that changes when it is determined that the read operation has failed until the reference voltage has been adjusted to the maximum reference voltage, and wherein the read operation is eventually determined as failed when it is determined that the read operation has failed although the criterion is adjusted.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification.

Figure 1:
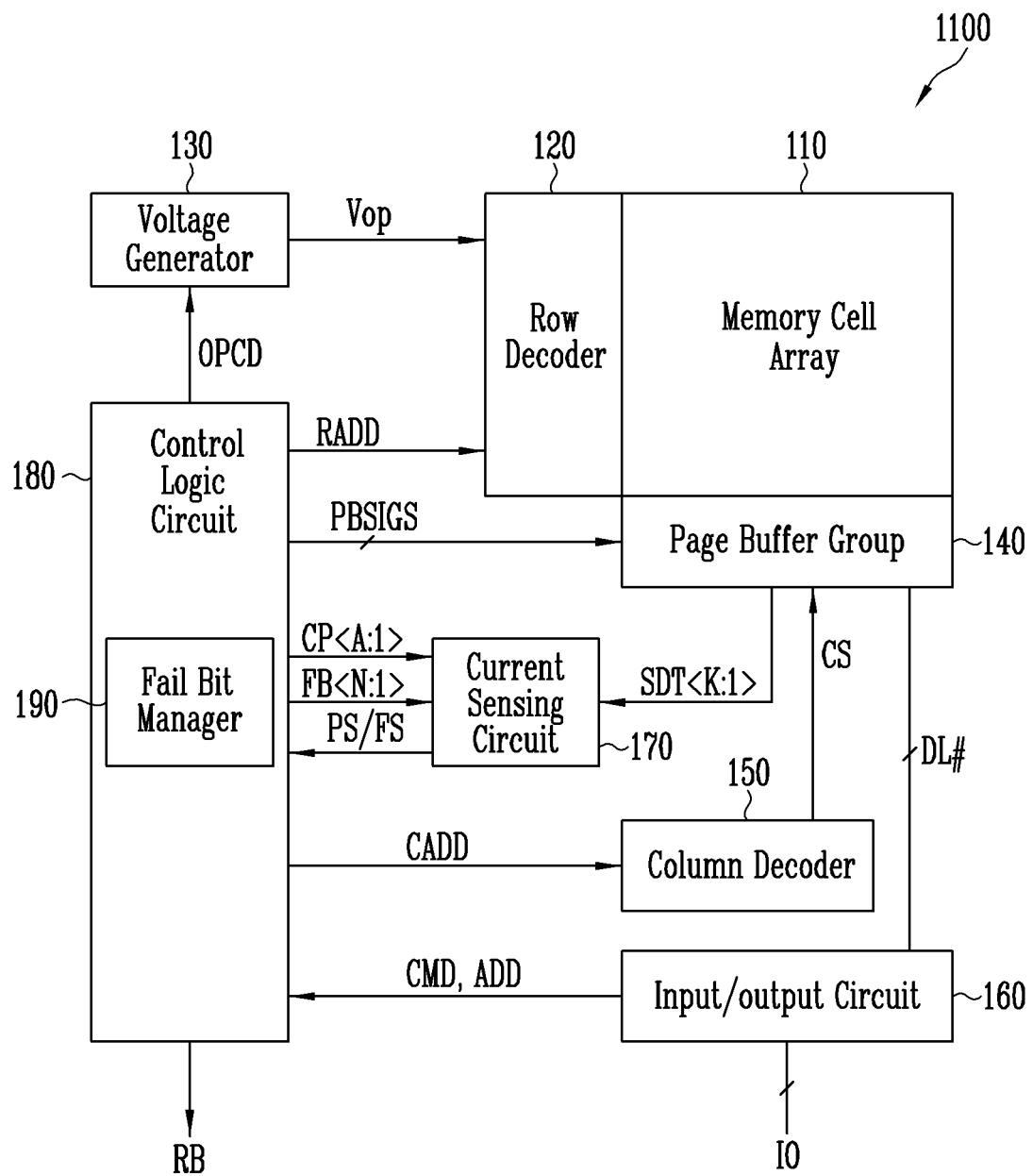
FIG. 1 is a diagram illustrating a memory device according to an embodiment of the present disclosure.

FIG. 1 is a diagram illustrating a memory device 1100 according to an embodiment of the present disclosure.

Referring to FIG. 1, the memory device 1100 may include a memory cell array 110, a row decoder 120, a voltage generator 130, a page buffer group 140, a column decoder 150, an input/output circuit 160, a current sensing circuit 170, and a control logic circuit 180.

The memory cell array 110 may include one or more planes, and each of the planes may include a plurality of memory blocks in which data is stored. Each of the memory blocks may include a plurality of memory cells, and the memory cells may be implemented in a two-dimensional structure in which the memory cells are arranged in parallel to a substrate or a three-dimensional structure in which the memory cells are stacked in a vertical direction on the substrate.

The row decoder 120 may select one memory block among the memory blocks included in the memory cell array 110 in response to a row address RADD and transmit operation voltages Vop to the selected memory block.

The voltage generator 130 may generate and output the operation voltages Vop required for various operations, in response to an operation code OPCD. For example, the voltage generator 130 may generate and output a program voltage, a verify voltage, a read voltage, an erase voltage, a pass voltage, and the like.

The page buffer group 140 may be connected to the memory cell array 110 through bit lines. For example, the page buffer group 140 may include page buffers connected to the respective bit lines. The page buffers may simultaneously operate in response to a page buffer control signals PBSIGS, and may temporarily store data during a program or read operation. Each of the page buffers may include a plurality of latches capable of storing data. Sensed data SDT<K:1> sensed through the bit lines may be stored in one of the plurality of latches included in the page buffer during a read or verify operation. During the read or verify operation, the plurality of page buffers may store the sensed data SDT<K:1> received through the bit lines. The sensed data SDT<K:1> may be data sensed from all selected pages among the pages included in the selected memory block, or may be data sensed from some chunks of the selected page.

The column decoder 150 may output a column selection signal CS in response to a column address CADD, and the plurality of page buffers included in the page buffer group 140 may store data loaded on a data line DL # in response to the column selection signal CS.

The input/output circuit 160 may connect the memory device 1100 and an external device to each other through input/output lines IO. Here, the external device may be a controller capable of controlling the memory device 1100. The input/output circuit 160 may receive a command CMD, an address ADD, and data or output the data to the external device through the input/output lines IO and may receive the data output from the page buffer group 140. The input/output circuit 160 may transmit the command CMD and the address ADD received through the input/output lines IO to the control logic circuit 180 and transmit the data to the page buffer group 140.

The current sensing circuit 170 may compare the number of fail bits included in the sensed data SDT<K:1> (K is a positive integer) with the allowable number of fail bits, and output a pass signal PS or a fail signal FS according to a comparison result. For example, the current sensing circuit 170 may generate a reference current according to a compensation code CP<A:1> (A is a positive integer) and an allowable fail bit code FB<N:1> (N is a positive integer), and generate a sensed current according to the sensed data SDT<K:1>. The current sensing circuit 170 may generate a reference voltage according to the reference current and may generate a sensed voltage according to the sensed current. The current sensing circuit 170 may generate the pass signal PS or the fail signal FS by comparing the reference voltage and the sensed voltage with each other.

For example, when the number of fail bits included in the sensed data SDT<K:1> (K is a positive integer) is less than or equal to an allowable number of fail bits, the current sensing circuit 170 may output the pass signal PS, and when the number of fail bits included in the sensed data SDT<K:1> (K is a positive integer) is greater than the allowable number of fail bits, the current sensing circuit 170 may output the fail signal FS.

The control logic circuit 180 may output the operation code OPCD, the row address RADD, the page buffer control signals PBSIGS and the column address CADD in response to the command CMD and the address ADD received from the external device through the input/output lines IO. For example, the control logic circuit 180 may include software that performs an algorithm for various operations in response to the command CMD, and hardware configured to output various signals according to the address ADD and the algorithm. While the read operation is performed, the control logic circuit 180 may output a ready signal RB to the external device to block receiving of a next command from the external device through the input/output lines IO. For example, the external device may be the controller capable of controlling the memory device 1100.

The control logic circuit 180 may include a fail bit manager 190 configured to determine a pass or a fail of the verify or read operation. In FIG. 1, the fail bit manager 190 is included in the control logic circuit 180, but according to an embodiment, the fail bit manager 190 may be separately provided outside the control logic circuit 180.

The fail bit manager 190 may output the compensation code CP<A:1> and the allowable fail bit code FB<N:1> during the verify or read operation, and may store or change the compensation code CP<A:1> and the allowable fail bit code FB<N:1> in response to the pass signal PS or the fail signal FS.

Figure 2:
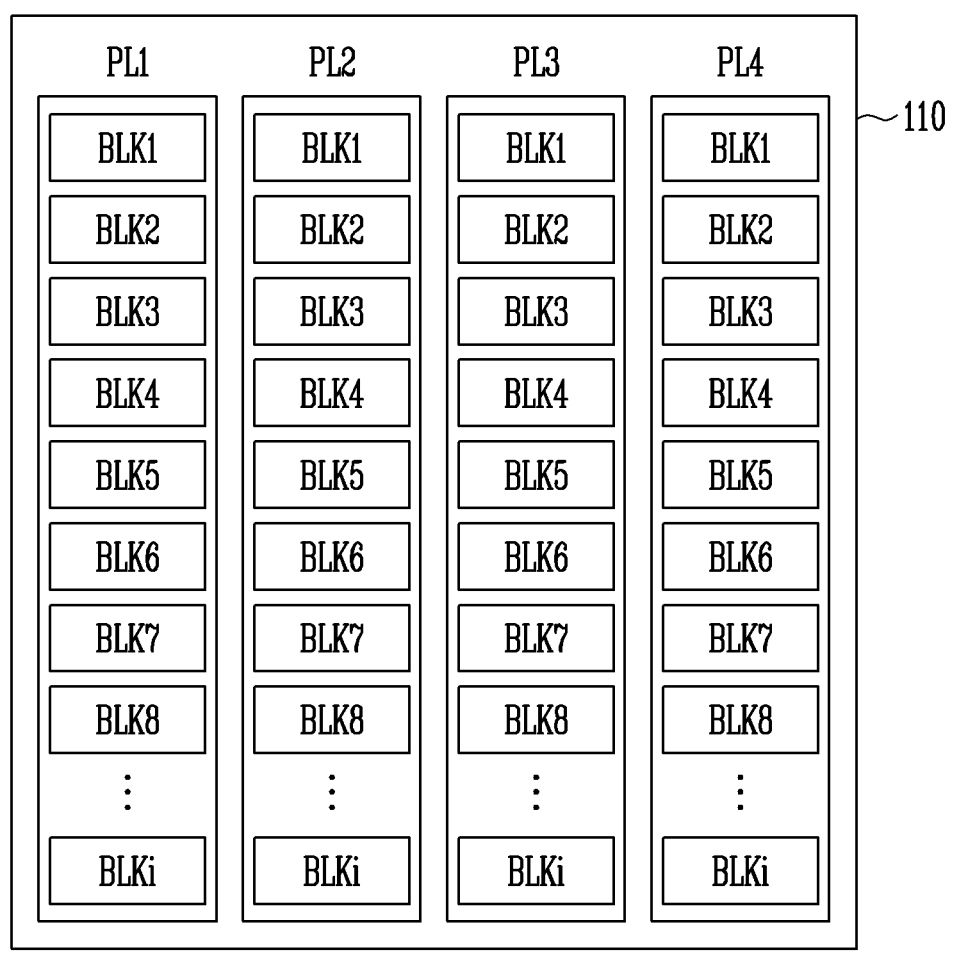
FIG. 2 is a diagram illustrating a memory cell array shown in FIG. 1, according to an embodiment of the present disclosure.

FIG. 2 is a diagram illustrating the memory cell array 110 shown in FIG. 1, according to an embodiment of the present disclosure.

Referring to FIG. 2, the memory cell array 110 may include a plurality of planes PL1 to PL4. Different page buffer groups 140 of FIG. 1 may be connected to the planes PL1 to PL4, respectively. Each of the planes PL1 to PL4 may include a plurality of memory blocks BLK1 to BLKi (i is a positive integer). Different row addresses may be set in the plurality of memory blocks BLK1 to BLKi. The program operation may be performed in a memory block selected according to the row address RADD of FIG. 1 output from the control logic circuit 180 of FIG. 1. Different local lines including word lines may be connected to the plurality of memory blocks BLK1 to BLKi, and bit lines may be commonly connected.

One of the plurality of memory blocks BLK1 to BLKi shown in FIG. 2 is specifically described as follows.

Figure 3:
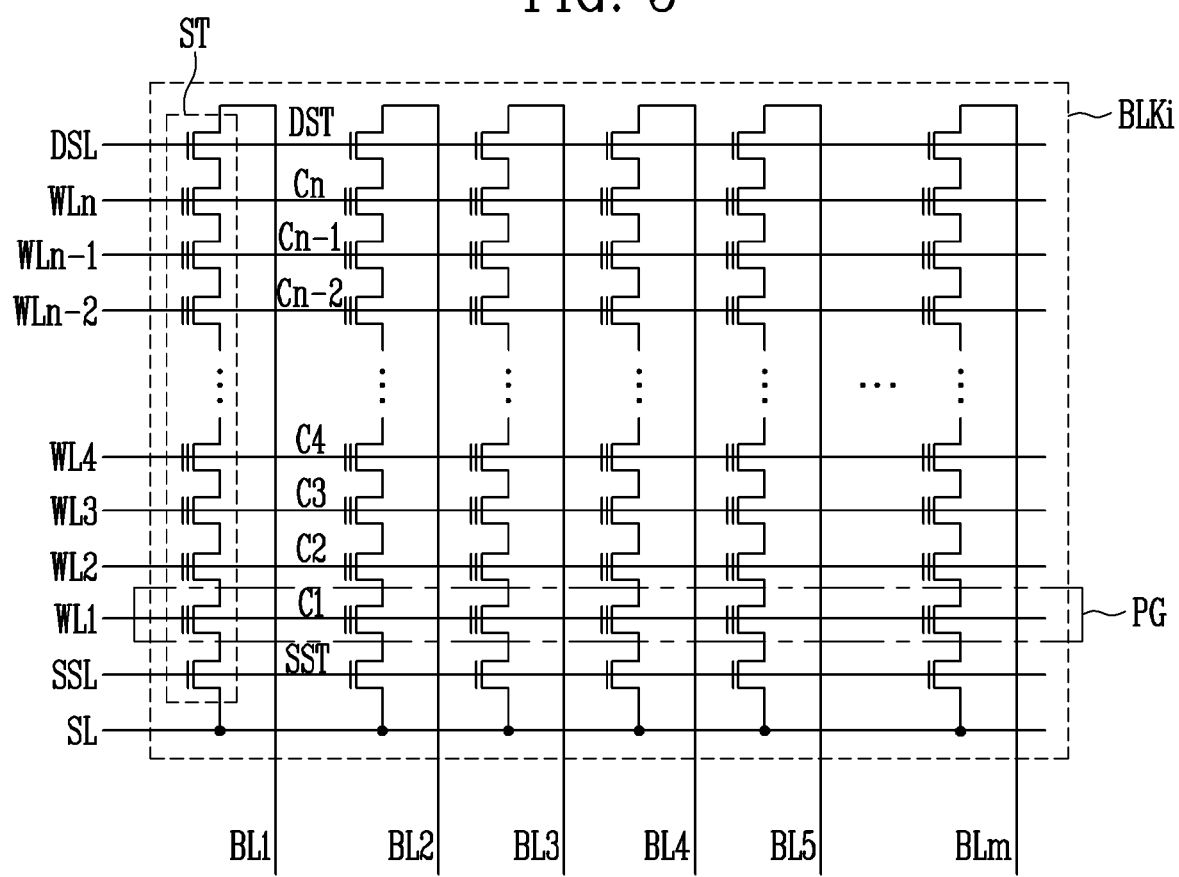
FIG. 3 is a diagram illustrating a memory block shown in FIG. 2, according to an embodiment of the present disclosure.

FIG. 3 is a diagram illustrating the memory block shown in FIG. 2, according to an embodiment of the present disclosure.

Referring to FIG. 3, a memory block BLKi among the plurality of memory blocks BLK1 to BLKi shown in FIG. 2 is shown as an embodiment.

The memory block BLKi may include a plurality of strings ST connected between first to m-th bit lines BL1 to BLm (m is a positive integer) and a source line SL. Each of the strings ST may include a source select transistor SST, first to n-th memories cells C1 to Cn (n is a positive integer), and a drain select transistor DST connected in series between the source line SL and the first to m-th bit lines BL1 to BLm (m is a positive integer).

Since the memory block BLKi shown in FIG. 3 is a diagram illustrating a configuration of the memory block, the number of source select transistors SST, first to n-th memory cells C1 to Cn, and drain select transistors DST is not limited to the number shown in FIG. 3.

Gates of the source select transistors SST connected to different strings ST may be connected to a source select line SSL, gates of each of the first to n-th memory cells C1 to Cn may be connected to first to n-th the word lines WL1 to WLn, and gates of the drain select transistors DST may be connected to a drain select line DSL.

A group of memory cells connected to the same word line and included in different strings ST may configure one page PG. The program operation or the read operation may be performed in a unit of a page PG.

Figure 4:
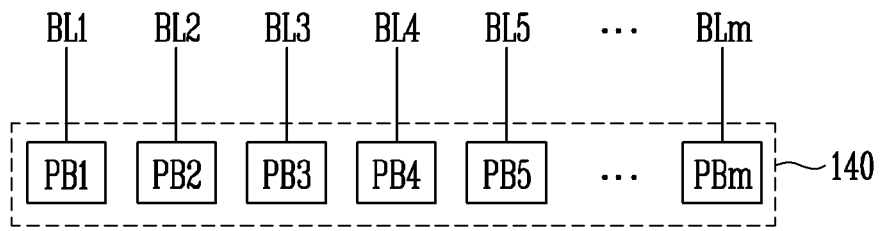
FIG. 4 is a diagram illustrating a page buffer group shown in FIG. 1, according to an embodiment of the present disclosure.

FIG. 4 is a diagram illustrating the page buffer group 140 shown in FIG. 1, according to an embodiment of the present disclosure.

Referring to FIG. 4, the page buffer group 140 may include the first to m-th page buffers PB1 to PBm (m is a positive integer). The first to m-th page buffers PB1 to PBm may be connected to the first to m-th bit lines BL1 to BLm, respectively. Each of the first to m-th page buffers PB1 to PBm may include a plurality of latches. During the verify or read operation on the selected page, the first to m-th page buffers PB1 to PBm may store sensed data in one of the plurality of latches by sensing a current or a voltage of the first to m-th bit lines BL1 to BLm, which is changed according to a threshold voltage of the memory cells. That is, one bit of sensed data may be stored in each of the first to m-th page buffers PB1 to PBm. Therefore, m bit of sensed data may be stored in all of the first to m-th page buffers PB1 to PBm.

Figure 5:
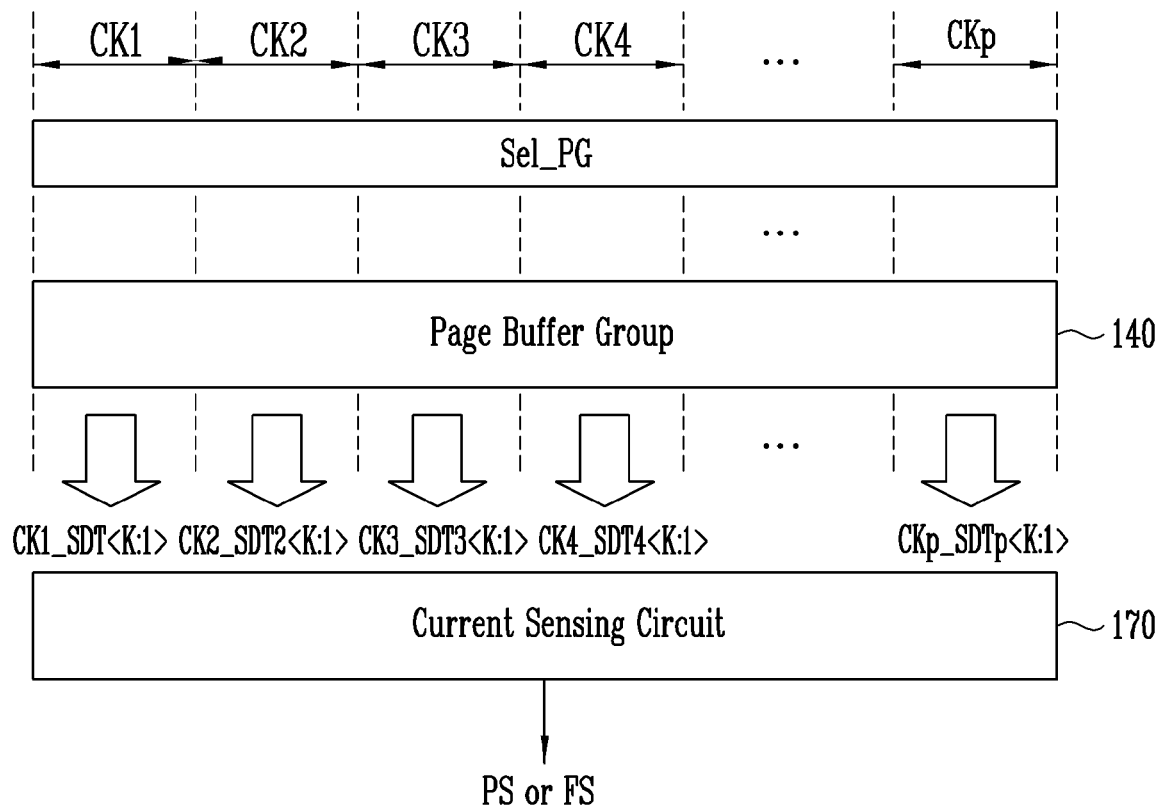
FIG. 5 is a diagram illustrating a method of sensing a selected page in a chunk unit according to an embodiment of the present disclosure.

FIG. 5 is a diagram illustrating a method of sensing a selected page in a chunk unit, according to an embodiment of the present disclosure.

Referring to FIG. 5, since a plurality of memory cells are included in a selected page Sel_PG among the plurality of pages included in the memory block, the number of memory cells is the same as the number of bits of the sensed data. As an integration degree of the memory device increases, the number of memory cells included in the selected page Sel_PG also increases.

When the number of memory cells included in the selected page Sel_PG increases, the number of bits of the sensed data required to be processed simultaneously during the verify or read operation increases. Therefore, in the present embodiment, the selected page Sel_PG may be divided into a plurality of chunks, and the sensed data may be processed in a chunk unit.

For example, the selected page Sel_PG may be divided into first to p-th chunks CK1 to CKp (p is a positive integer), and the plurality of memory cells may be included in the first to p-th chunks CK1 to CKp. That is, the memory cells included in the selected page Sel_PG may be divided into p groups, and each group may configure one chunk.

During the verify or read operation, the sensed data sensed from all memory cells included in the selected page Sel_PG may be simultaneously stored in the page buffer group 140, and the sensed data stored in the page buffer group 140 may be sequentially output to the current sensing circuit 170 in the chunk unit. For example, when K memory cells are included in each of the first to p-th chunks CK1 to CKp, data sensed from the first chunk CK1 may be first sensed chunk data CK1_SDT<K:1>, data sensed from the second chunk CK2 may be second sensed chunk data CK2_SDT2<K:1>, and data sensed from the p-th chunk CKp may be p-th sensed chunk data CKp_SDTp<K:1>. That is, during the verify or read operation, when the sensing operation of the selected page Sel_PG is performed, the first to p-th sensed chunk data CK1_SDT<K:1> to CKp_SDTp<K:1> may be stored in the page buffer group 140. When the sensing operation is completed, the page buffer group 140 may sequentially output the first to p-th sensed chunk data CK1_SDT<K:1> to CKp_SDTp<K:1>. For example, the page buffer group 140 may output the first sensed chunk data CK1_SDT<K:1>, and then output the second sensed chunk data CK2_SDT2<K:1>.

The current sensing circuit 170 may perform a fail bit count operation in an order in which the first to p-th sensed chunk data CK1_SDT<K:1> to CKp_SDTp<K:1> are output. For example, when the first sensed chunk data CK1_SDT<K:1> is input to the current sensing circuit 170, the current sensing circuit 170 may perform a fail bit count operation for the first sensed chunk data CK1_SDT<K:1>, and output the pass signal PS or the fail signal FS for the first sensed chunk data CK1_SDT<K:1>. Subsequently, when the second sensed chunk data CK2_SDT2<K:1> is input to the current sensing circuit 170, the current sensing circuit 170 may perform a fail bit count operation for the second sensed chunk data CK2_SDT2<K:1>, and output the pass signal PS or the fail signal FS for the second sensed chunk data CK2_SDT2<K:1>. In such a method, the current sensing circuit 170 may sequentially output the pass signal PS or the fail signal FS for each of the first to p-th sensed chunk data CK1_SDT<K:1> to CKp_SDTp<K:1>.

The current sensing circuit 170 may compare the number of fail bits included in the sensed data with the allowable number of fail bits, and output the pass signal PS or the fail signal FS according to the comparison result. In the present embodiment, a method of using a current that changes according to the number of fail bits may be used instead of a method of respectively counting the sensed data in a bit unit. The current sensing circuit 170 according to an embodiment is specifically described as follows.

Figure 6:
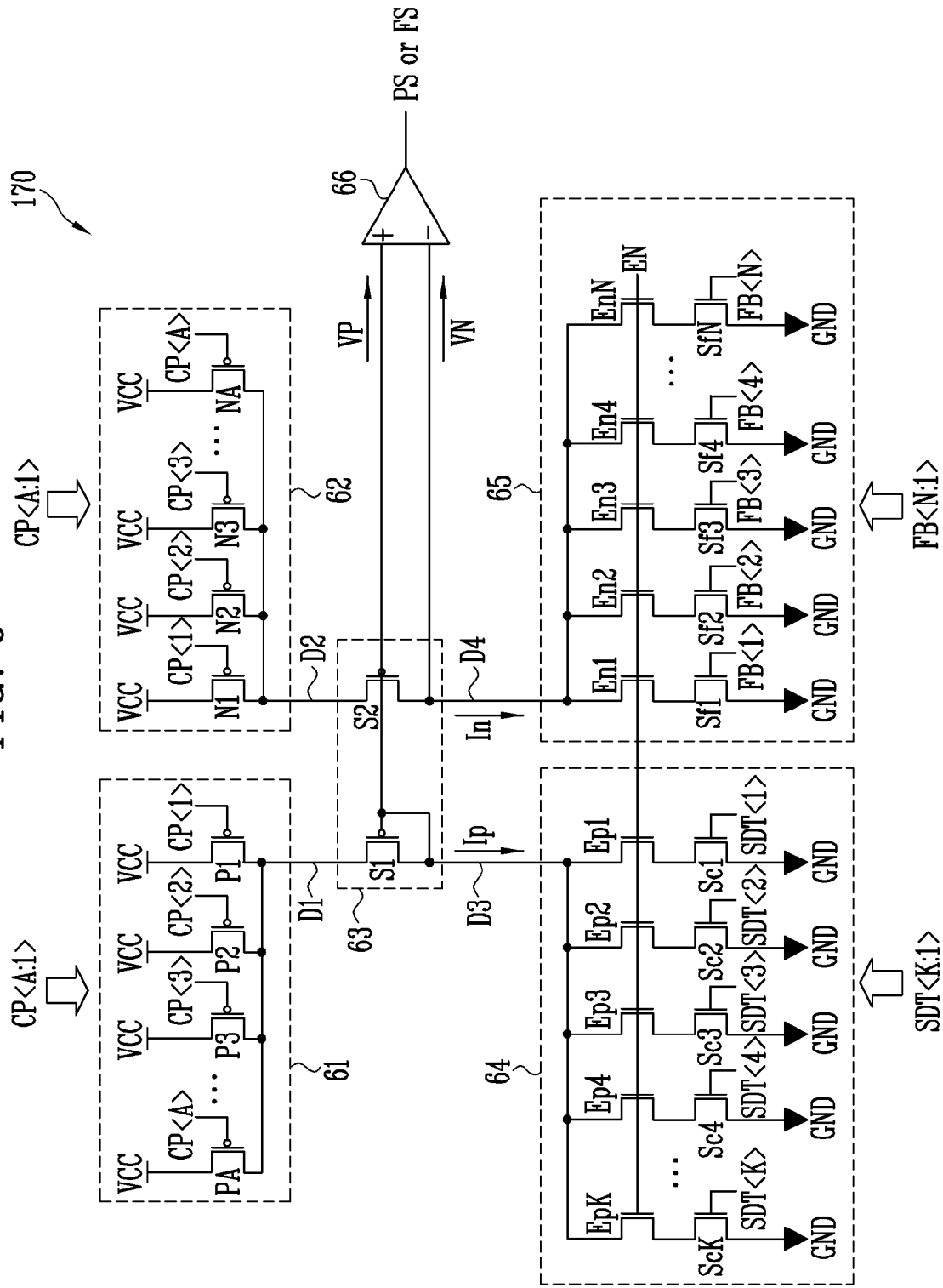
FIG. 6 is a circuit diagram illustrating a current sensing circuit according to an embodiment of the present disclosure.

FIG. 6 is a circuit diagram illustrating a current sensing circuit 170 according to an embodiment of the present disclosure.

Referring to FIG. 6, the current sensing circuit 170 may include a first compensation circuit 61, a second compensation circuit 62, a voltage output circuit 63, a sensed data receiver 64, a fail bit receiver 65, and a comparison circuit 66.

The first compensation circuit 61 may be configured to vary a current of a first node D1 in response to the compensation code CP<A:1> (A is a positive integer), and the second compensation circuit 62 may be configured to vary a current of a second node D2 in response to the compensation code CP<A:1>. That is, the first and second compensation circuits 61 and 62 may be configured in the same structure and may be connected to different first or second nodes D1 or D2. According to the compensation code CP<A:1>, a ratio of the number of fail bits and the allowable number of fail bits corresponding to the number of fail bits may be determined, and a reference for outputting the pass signal PS or the fail signal FS may be changed according to the ratio. For example, when the ratio is 1, if the detected number of fail bits is greater than the allowable number of fail bits, the fail signal FS is output, and if the detected number of fail bits is less than the allowable number of fail bits, a pass signal PS is output.

The first compensation circuit 61 may include first to A-th compensation switches P1 to PA connected in parallel between a terminal to which a power voltage VCC is supplied and the first node D1. The first to A-th compensation switches P1 to PA may be implemented as a PMOS transistor that is turned on or turned off in response to each of the bits included in the compensation code CP<A:1>. For example, the first compensation switch P1 may be configured to be turned on or turned off in response to a first compensation code CP<1>, and the second compensation switch P2 may be configured to be turned on or turned off in response to a second compensation code CP<2>.

The second compensation circuit 62 may be configured identically to the first compensation circuit 61. For example, the second compensation circuit 62 may include first to A-th compensation switches Ni to NA connected in parallel between the terminal to which the power voltage VCC is supplied and the second node D2.

The compensation code CP<A:1> input to the first and second compensation circuits 61 and 62 may be formed of a combination of 0, a combination of 0 and 1, or a combination of 1. For example, when 1 is defined as a compensation value in the compensation code CP<A:1>, the ratio of the number of fail bits and the allowable number of fail bits corresponding to the number of fail bits may be changed according to the number of the compensation values. In the present embodiment, 0 data is defined as the compensation value among codes configuring the compensation code CP<A:1>, but 1 data may be defined according to a structure of the current sensing circuit 170. In an embodiment described below, the compensation value is the 0 data.

The voltage output circuit 63 may include first and second switches S1 and S2 configured to generate a sensed voltage VP and a reference voltage VN. The first switch S1 is connected between a first node D1 and a third node D3 and may be implemented as a PMOS transistor that outputs the sensed voltage VP. A gate of the first switch S1 may be connected to the third node D3, and the sensed voltage VP generated according to a compensation current Ip of the third node D3 may be output the gate of the first switch S1. That is, the first switch S1 may generate the sensed voltage VP according to the compensation current Ip flowing through the third node D3, and a turn-on level may be adjusted according to the sensed voltage VP applied to the gate of the first switch S1. The second switch S2 is connected between the second node D2 and a fourth node D4, and may be implemented as a PMOS transistor that outputs the reference voltage VN. Since a gate of the second switch S2 is connected to the gate of the first switch S1, a turn-on level of the second switch S2 is the same as the turn-on level of the first switch S1. The reference voltage VN may be output through the fourth node D4, and a level of the reference voltage VN may be determined by a current flowing through the fourth node D4.

The sensed data receiver 64 may be configured to generate the compensation current Ip in response to an enable signal EN and the sensed data SDT<K:1>. For example, the sensed data receiver 64 may include first to K-th enable switches Ep1 to EpK and first to K-th sensing switches Sc1 to ScK connected between the third node D3 and a ground terminal GND. The first to K-th enable switches Ep1 to EpK and the first to K-th sensing switches Sc1 to ScK may respectively form a pair with each other. For example, the first enable switch Ep1 and the first sensing switch Sc1 may form a pair with each other and may be connected in series between the third node D3 and the ground terminal GND, and the second enable switch Ep2 and the second sensing switch Sc2 may form a pair with each other and may be connected in series between the third node D3 and the ground terminal GND. In such a method, the K-th enable switch EpK and the K-th sensing switch ScK may form a pair with each other and may be connected between the third node D3 and the ground terminal GND.

The first to K-th enable switches Ep1 to EpK may be implemented as an NMOS transistor connected between the third node D3 and the first to K-th sensing switches Sc1 to ScK. Gates of the first to K-th enable switches Ep1 to EpK may be connected to each other. Therefore, when an enable signal EN having a logic high level is applied to the gates of the first to K-th enable switches Ep1 to EpK, the first to K-th enable switches Ep1 to EpK may be simultaneously turned on. That is, when the enable signal EN has the logic high level, the current sensing circuit 170 may be activated, and when the enable signal EN has a logic low level, the current sensing circuit 170 may be deactivated.

The first to K-th sensing switches Sc1 to ScK may be implemented as an NMOS transistor connected between the first to K-th enable switches Ep1 to EpK and the ground terminal GND. The first to K-th sensing switches Sc1 to ScK may be implemented as an NMOS transistor that is turned on or turned off in response to each of the bits included in the sensed data SDT<K:1>. For example, the first sensing switch Sc1 may be configured to be turned on or turned off in response to first sensed data SDT<1>, and the second sensing switch Sc2 may be configured to be turned on or turned off in response to second sensed data SDT<2>. In such a method, the K-th sensing switch ScK may be configured to be turned on or turned off in response to K-th sensed data SDT<K>.

The first to K-th sensed data SDT<K:1> may be data sensed from the entire selected page or data sensed from a chunk included in the selected page. Such a setting may be changed according to the memory device. For example, when the number of memory cells included in a page is less than a reference number, the first to K-th sensed data SDT<K:1> may be the data sensed in the entire selected page. When the number of memory cells included in the page is greater than or equal to the reference number, the first to K-th sensed data SDT<K:1> may be the data sensed from the chunk included in the selected page.

Since the first to K-th sensing switches Sc1 to ScK are turned on or turned off according to the first to K-th sensed data SDT<K:1>, the number of turned-on switches among the first to K-th sensing switches Sc1 to ScK also increases as the number of bits having a logic high level increases in the first to K-th sensed data SDT<K:1>.

When a bit having a logic high level has a value of 1 and the bit having the value of 1 is a detected fail bit, as the number of bits having the value of 1 increases in the first to K-th sensed data SDT<K:1>, the compensation current Ip may increase and a level of the sensed voltage VP may increase. That is, as the detected number of fail bits increases, the level of the sensed voltage VP may increase.

The fail bit receiver 65 may be configured to generate a reference current In in response to the enable signal EN and the allowable fail bit code FB<N:1>. For example, the fail bit receiver 65 may include first to N-th enable switches En1 to EnN and first to N-th fail switches Sf1 to SfN connected between the fourth node D4 and the ground terminal GND. The first to N-th enable switches En1 to EnN and the first to N-th fail switches Sf1 to SfN may respectively form a pair with each other. For example, the first enable switch En1 and the first fail switch Sf1 may form a pair with each other and may be connected in series between the fourth node D4 and the ground terminal GND, and the second enable switch Ent and the second fail switch Sf2 may form a pair with each other and may be connected in series between the fourth node D4 and the ground terminal GND. In such a method, the N-th enable switch EnN and the N-th fail switch SfN may form a pair with each other and may be connected between the fourth node D4 and the ground terminal GND.

The first to N-th enable switches En1 to EnN may be implemented as an NMOS transistor connected between the fourth node D4 and the first to N-th fail switches Sf1 to SfN. Gates of the first to N-th enable switches En1 to EnN may be connected to each other. Therefore, when an enable signal EN having a logic high level is applied to the gates of the first to N-th enable switches En1 to EnN, the first to N-th enable switches En1 to EnN may be simultaneously turned on. That is, when the enable signal EN has the logic high level, the current sensing circuit 170 may be activated, and when the enable signal EN has a logic low level, the current sensing circuit 170 may be deactivated.

The first to N-th fail switches Sf1 to SfN may be implemented as an NMOS transistor connected between the first to N-th enable switches Ent to EnN and the ground terminal GND. The first to N-th fail switches Sf1 to SfN may be implemented as an NMOS transistor that is turned on or turned off in response to each of the bits included in the allowable fail bit code FB<N:1>. For example, the first fail switch Sf1 may be configured to be turned on or turned off in response to a first allowable fail bit code FB<1>, and the second fail switch Sf2 may be configured to be turned on or turned off in response to a second allowable fail bit code FB<2>. In such a method, the N-th fail switch SfN may be configured to be turned on or turned off in response to the N-th allowable fail bit code FB<N>.

The first to N-th allowable fail bit codes FB<N:1> may be codes that may be changed according to the algorithm executed in the control logic circuit 180 of FIG. 1, and may be compared with the number of fail bits included in the first to K-th sensed data SDT<K:1>. That is, the first to N-th allowable fail bit codes FB<N:1> may be a reference for determining whether the verify or read operation in which the first to K-th sensed data SDT<K:1> are sensed is passed or failed.

Since the first to N-th fail switches Sf1 to SfN are turned on or turned off according to the first to N-th allowable fail bit codes FB<N:1>, the number of turned-on switches among the first to N-th fail switches Sf1 to SfN also increases as the number of bits having a logic high level increases in the first to N-th allowable fail bit codes FB<N:1>.

When a bit having a logic high level has a value of 1 and the bit having the value of 1 is an allowable fail bit code, as the number of bits having the value of 1 increases in the first to N-th allowable fail bit codes FB<N:1>, the reference current In may increase and a level of the reference voltage VN may increase. That is, as the number of bits having the value of 1 included in the first to N-th allowable fail bit codes FB<N:1> increases, the detected number of fail bits on which the verify or read operation may be passed may increase.

The comparison circuit 66 may include a comparator configured to compare the sensed voltage VP and the reference voltage VN with each other and output the pass signal PS or the fail signal FS according to a comparison result. For example, the comparator may be configured so that the sensed voltage VP is applied to a plus (+) input terminal and the reference voltage VN is applied to a minus (−) input terminal. The comparator may output the pass signal PS having a logic low level when the sensed voltage VP is lower than or equal to the reference voltage VN and output the fail signal FS having a logic high level when the sensed voltage VP is higher than the reference voltage VN.

Figure 7A:
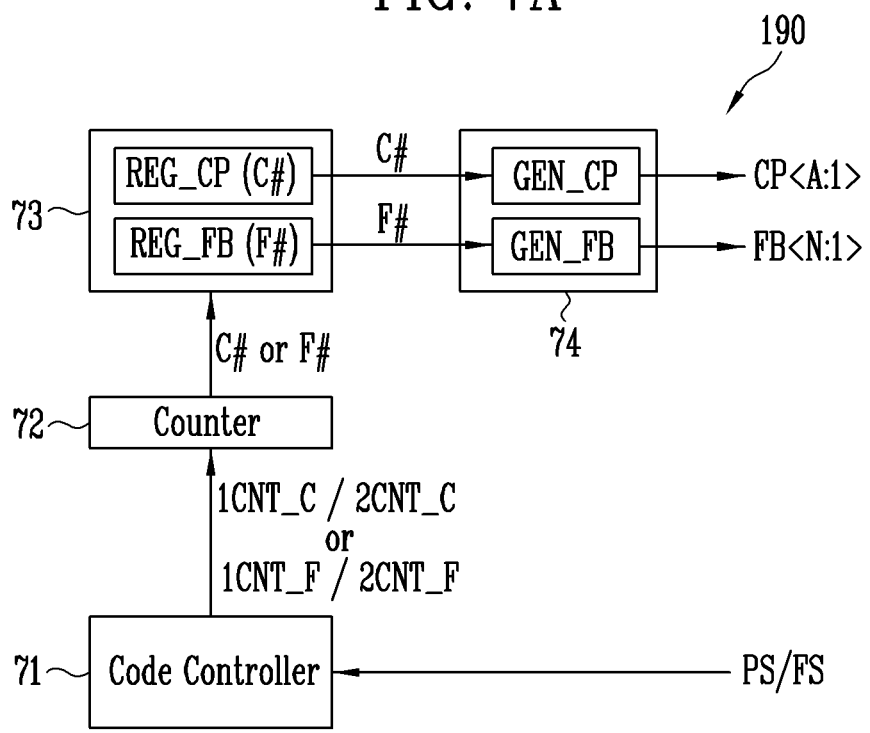
FIGS. 7A to 7C are diagrams illustrating a fail bit manager according to an embodiment of the present disclosure.
Figure 7B:
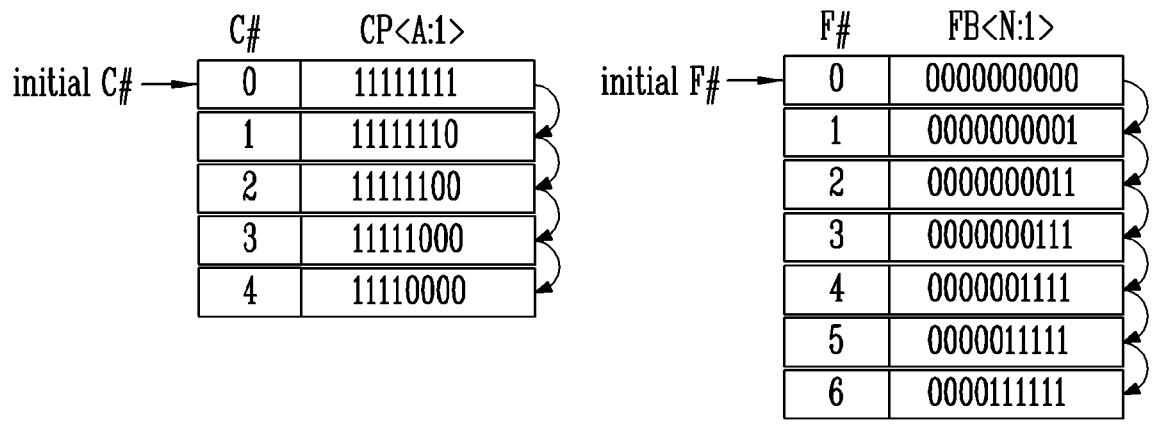
Figure 7C:
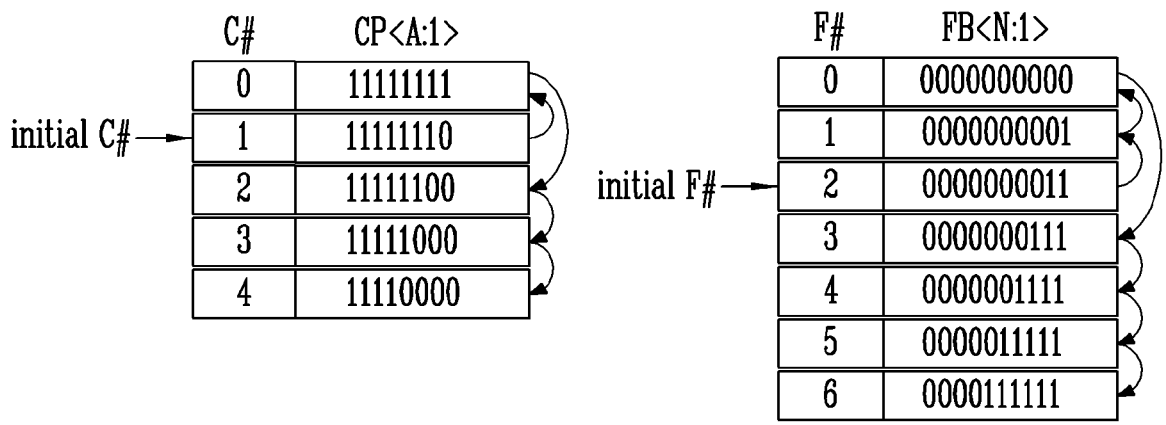

FIGS. 7A to 7C are diagrams illustrating a fail bit manager according to an embodiment of the present disclosure.

Referring to FIG. 7A, the fail bit manager 190 may include a code controller 71, a counter 72, a register 73, and a code output circuit 74.

The code controller 71 may be configured to generally control the fail bit manager 190 during the verify or read operation. The code controller 71 may be configured to output a first or second compensation count signal 1CNT_C or 2CNT_C or a first or second fail count signal 1CNT_F or 2CNT_F in response to the pass signal PS or the fail signal FS. For example, when performing an algorithm for setting a fail bit, the code controller 71 may be configured to output the first or second fail count signal 1CNT_F or 2CNT_F in response to the pass signal PS or the fail signal FS. A code controller 71 may be configured to output the first or second compensation count signal 1CNT_C or 2CNT_C in response to the pass signal PS or the fail signal FS when performing an algorithm for setting the compensation value.

More specifically, when the algorithm for setting the fail bit is performed, the code controller 71 may be configured to output the first fail count signal 1CNT_F in response to the fail signal FS, and output the second fail count signal 2CNT_F in response to the pass signal PS. When the algorithm for setting the compensation value is performed, the code controller 71 may be configured to output the first compensation count signal 1CNT_C in response to the fail signal FS, and output the second compensation count signal 2CNT_C in response to the pass signal PS.

The counter 72 may be configured to set an allowable number F # of fail bits or a number C # of the compensation values in response to the first fail count signal 1CNT_F, the second fail count signal 2CNT_F, the first compensation count signal 1CNT_C, or the second compensation count signal 2CNT_C, and output the set allowable number F # of fail bits or number C # of the compensation values. For example, the counter 72 may output the increased allowable number F # of fail bits increased each time the first fail count signal 1CNT_F is received and output the most recently set allowable number F # of fail bits when the second fail count signal 2CNT_F is received. The counter 72 may output the increased number C # of the compensation values increased each time the first compensation count signal 1CNT_C is received, and output the most recently set number C # of the compensation values when the second compensation count signal 2CNT_C is received.

The register 73 may be configured to store the number C # of the compensation values and the allowable number F # of fail bits output from the counter 72, and output the stored number C # of the compensation values and allowable number F # of fail bits. For example, the register 73 may include a compensation value register REG_CP configured to store and output the number C # of the compensation values, and a fail bit register REG_FB configured to store and output the allowable number F # of fail bits.

The code output circuit 74 may be configured to output the compensation code CP<A:1> or the allowable fail bit code FB<N:1> in response to the number C # of the compensation values or the allowable number F # of fail bits. For example, the code output circuit 74 may include a compensation code generator GEN_CP configured to generate and output the compensation code CP<A:1> in response to the number C # of the compensation values, and a fail bit generator GEN_FB configured to output the allowable fail bit code FB<N:1> in response to the allowable number F # of fail bits. The compensation code CP<A:1> is a code including A bits, and the allowable fail bit code FB<N:1> is a code including N bits. The compensation code generator GEN_CP may increase the number of bits having a value of 0 which are included in the compensation code CP<A:1> each time the number C # of the compensation values increases. The fail bit generator GEN_FB may increase the number of bits having a value of 1 which are included in the allowable fail bit code FB<N:1> each time the allowable number F # of fail bits increases.

Referring to FIG. 7B, one example of the compensation code CP<A:1> and the allowable fail bit code FB<N:1> that may be generated according to the number C # of the compensation values and the allowable number F # of fail bits is shown, according to an embodiment of the present disclosure. In an embodiment, A is 8 and the compensation value is 0 data. In this case, when the number C # of the compensation values is 0, the compensation code CP<A:1> may be generated as 11111111, when the number C # of the compensation values is 1, the compensation code CP<A:1> may be generated as 11111110, and when the number C # of the compensation values is 4, the compensation code CP<A:1> may be generated as 11110000. That is, the number of bits having a value of 0 which are included in the compensation code CP<A:1> may be proportional to the number C # of the compensation values. In an embodiment, when N is 10, when the allowable number F # of fail bits is 0, the allowable fail bit code FB<N:1> may be generated as 0000000000, when the allowable number F # of fail bits is 1, the allowable fail bit code FB<N:1> may be generated as 0000000001, and when the allowable number F # of fail bits is 4, the allowable fail bit code FB<N:1> may be generated as 0000001111. That is, the number of bits having a value of 1 which are included in the allowable fail bit code FB<N:1> may be proportional to the allowable number F # of fail bits. In the embodiment shown in 7B, when an initial number initial C # of the compensation values and an initial allowable number initial F # of fail bits are set as 0 which is a minimum value, the number C # of the compensation values and the allowable number F # of fail bits may be selected in an order of increasing sequentially each time the read operation is failed.

Referring to FIG. 7C, the initial number 'initial C #' of the compensation values and the initial allowable number 'initial F #' of fail bits may be set as arbitrary numbers other than the minimum value. For example, when the initial number 'initial C #' of the compensation values is set as 1, the number C # of the compensation values selected next may be lowered to 0, and the number C # of the compensation values selected next may increase to 2. When the initial allowable number 'initial F #' of fail bits is set as 2, the allowable number F # of fail bits may be sequentially lowered in an order of 1, 0 each time the read operation is failed. When it is determined that the read operation is failed even at the minimum value, the allowable number F # of fail bits may increase to 3, and may increase sequentially from 3.

The initial number 'initial C #' of the compensation values and the initial allowable number 'initial F #' of fail bits may be set as various values in addition to the embodiment described with reference to FIG. 7B or 7C, and the order in which the number is selected may be variously changed.

Figure 8A:
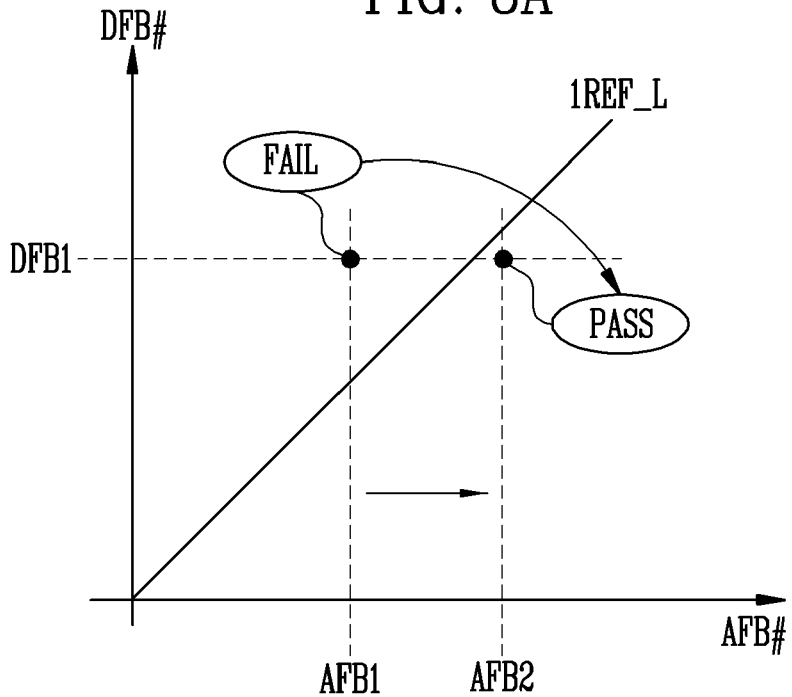
FIG. 8A is a diagram illustrating an embodiment in which a pass signal is output by changing an allowable number of fail bits according to an embodiment of the present disclosure.

FIG. 8A is a diagram illustrating an embodiment in which a pass signal is output by changing the allowable number of fail bits, according to an embodiment of the present disclosure.

Referring to FIG. 8A, a slope of a first reference line 1REF_L for which the pass or the fail is determined according to an allowable number AFB # of fail bits and a detected number DFB # of fail bits is constant. When a first detected number DFB1 of fail bits included in the sensed data is greater than a first allowable number AFB1 of fail bits based on the first reference line 1REF_L, the verify or read operation may be failed. When the verify or read operation is failed, the fail bit manager 190 of FIG. 1 may increase the first allowable number AFB1 of fail bits to a second allowable number AFB2 of fail bits.

When the second allowable number AFB2 of fail bits is greater than the first detected number DFB1 of fail bits based on the first reference line 1REF_L, the verify or read operation may be passed. Therefore, the first detected number DFB1 of fail bits may be calculated by referring to the second allowable number AFB2 of fail bits used when the verify or read operation is passed. For example, the number of fail bits increased from allowable number AFB1 of fail bits to allowable number AFB2 of fail bits may be detected number DFB1 of fail bits.

Figure 8B:
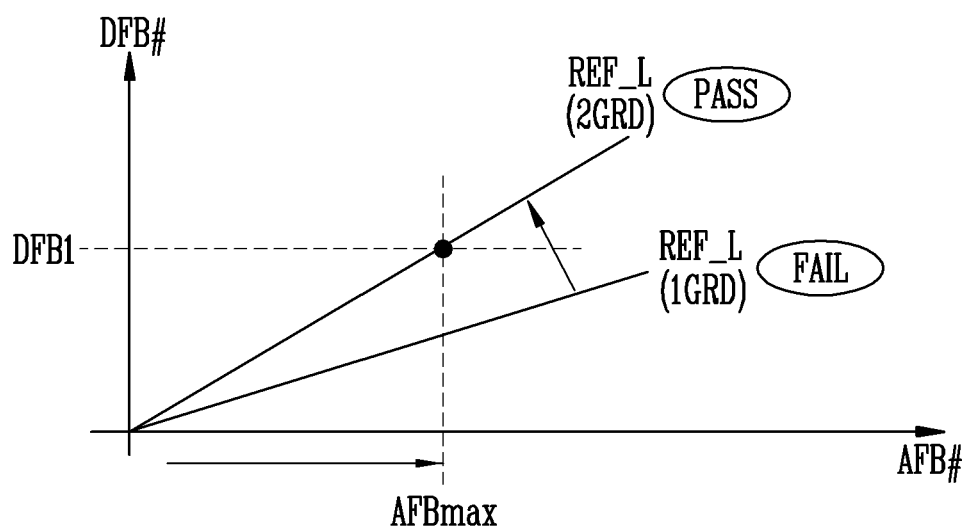
FIG. 8B is a diagram illustrating an embodiment in which the pass signal is output by changing a number of compensation values according to an embodiment of the present disclosure.

FIG. 8B is a diagram illustrating an embodiment in which a pass signal is output by changing the number of the compensation values, according to an embodiment of the present disclosure.

Referring to FIG. 8B, when the verify or read operation is failed until the allowable number AFB # of fail bits increases to a maximum allowable number AFBmax of fail bits, the allowable number AFB # of fail bits does not increase any more. In this case, the fail bit manager 190 of FIG. 1 may increase a first slope 1GRD of a reference line REF_L to a second ratio 2GRD while maintaining the maximum allowable number AFBmax of fail bits. For example, since the first detected number DFB1 of fail bits and the maximum allowable number AFBmax of fail bits are fixed, the verify or read operation may be passed when increasing the slope of the reference line REF_L.

Figure 9:
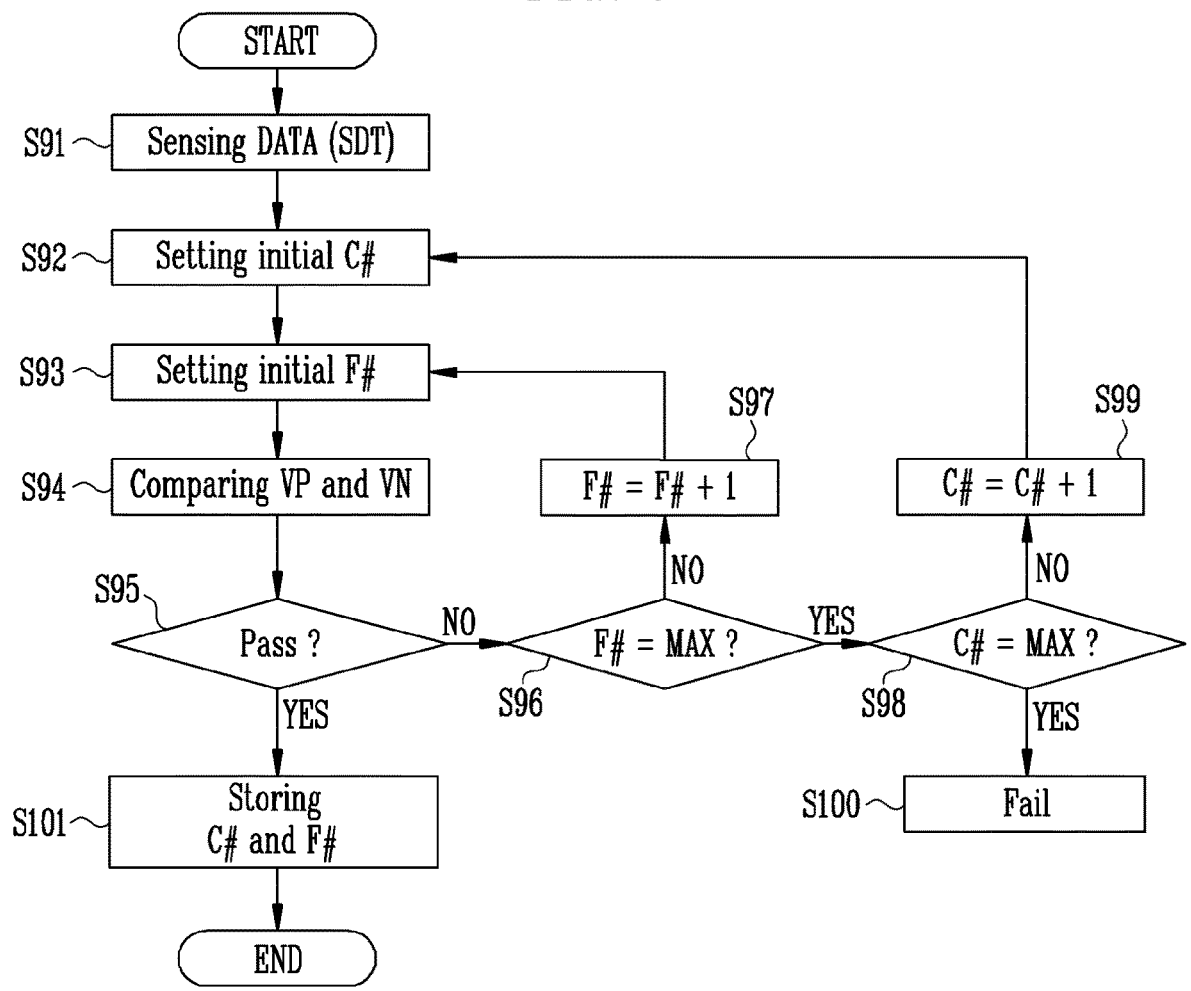
FIG. 9 is a diagram illustrating a fail bit count operation according to an embodiment of the present disclosure.

FIG. 9 is a diagram illustrating a fail bit count operation according to an embodiment of the present disclosure.

Referring to FIG. 9, the fail bit count operation performed in the read operation is described as an embodiment as follows.

When the read operation of the selected page is started, the read voltage may be applied to the selected word line connected to the selected page, and data of the memory cells may be sensed based on the read voltage (S91). For example, the sensed data may be stored as sensed data SDT in the page buffers.

The fail bit manager 190 of FIG. 1 may set an initial value of the number C # of the compensation values (S92), and set an initial value of the allowable number F # of fail bits (S93). The initial value of the number C # of the compensation values may be set as 0 or a positive integer, and the initial value of the allowable number F # of fail bits may be set as 0 or a positive integer.

Subsequently, the current sensing circuit 170 of FIG. 6 may receive the sensed data SDT output from the page buffers and compare the sensed voltage VP and the reference voltage VN generated according to the sensed data SDT and the allowable fail bit (S94).

The current sensing circuit 170 of FIG. 6 may determine whether the read operation is passed according to the reference voltage VN and the sensed voltage VP (S95). For example, when the sensed voltage VP is higher than the reference voltage VN, the current sensing circuit 170 of FIG. 6 may output the fail signal FS, and the fail bit manager 190 of FIG. 1 may determine that the read operation is failed according to the fail signal FS (NO in S95).

When it is determined that the read operation is failed (NO) in operation S95, the fail bit manager 190 of FIG. 1 checks whether the allowable number F # of fail bits is the maximum value (S96).

When the allowable number F # of fail bits is not the maximum value (NO in S96), the fail bit manager 190 of FIG. 1 increases the allowable number F # of fail bits (S97). For example, the fail bit manager 190 of FIG. 1 may increase the allowable number F # of fail bits by 1, but according to the memory device, the fail bit manager 190 of FIG. 1 may increase the allowable number F # of fail bits by a positive integer greater than 1.

The fail bit manager 190 of FIG. 1 may set the allowable number F # of fail bits changed in operation S97 as the allowable number to be used in a next read operation, and determine whether the read operation is passed by performing operations S94 and S95 again. That is, an operation of finding the allowable number F # of fail bits when the read operation is passed by repeating operations S93, S94, S95, S96, and S97 may correspond to the embodiment described with reference to FIG. 8A.

In operation S96, when the allowable number F # of fail bits reaches the maximum value (YES), the fail bit manager 190 of FIG. 1 checks whether the number C # of the compensation values is a maximum value for changing the slope (1GRD of FIG. 8B) of the reference line (S98). For example, the fail bit manager 190 of FIG. 1 may increase the number C # of the compensation values so that the ratio of the fail bit with respect to the allowable number of fail bits increases.

When the number C # of the compensation values is not the maximum value (NO in S98), the fail bit manager 190 of FIG. 1 increases the number C # of the compensation values (S99). For example, the fail bit manager 190 of FIG. 1 may increase the number of 1 data among data included in the compensation values.

The fail bit manager 190 of FIG. 1 may calculate the number of fail bits included in the sensed data SDT according to the number C # of the compensation values changed in operation S99. That is, an operation of finding the number C # of the compensation values when the read operation is passed by repeating operations S93, S94, S95, S96, S98, and S99 may correspond to the embodiment described with reference to FIG. 8B.

In operation S98, when operation S95 is failed until the number C # of the compensation values reaches the maximum value, it means that the read operation is failed until the number C # of the compensation values and the allowable number F # of fail bits have their respective maximum values, and thus the fail bit manager 190 of FIG. 1 may process the read operation as the fail (S100).

In operation S95, when the read operation is passed (YES), the fail bit manager 190 of FIG. 1 may store the most recently set number C # of the compensation values and allowable number F # of fail bits (S101). That is, since the allowable number F # of fail bits gradually increases until the operation S95 is passed, the number of fail bits included in the sensed data SDT may be calculated according to the allowable number F # of fail bits and the number C # of the compensation values stored when operation S95 is passed.

In methods (for example, an MLC, a TLC, a QLC, . . . ) in which two or more bits of data are stored in one memory cell, the memory cells may be programmed to have a plurality of threshold voltage distributions. The MLC refers to a multi-level cell method in which two bits of data is stored in one memory cell, the TLC refers to a triple level cell method in which three bits of data is stored in one memory cell, and the QLC refers to a quadruple level cell method in which four bits of data is stored in one memory cell. Therefore, in the MLC or higher method, the read operation may be performed using a plurality of read voltages, and the above-described embodiment may be performed in each of the read operations using different read voltages. The read operation of the TLC method among the methods is described as an example.

Figure 10:
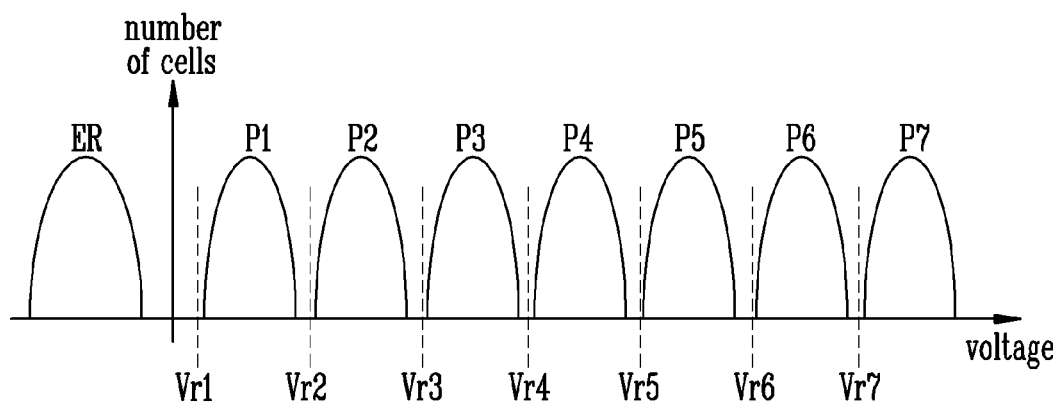
FIG. 10 is a diagram illustrating a threshold voltage of memory cells according to an embodiment of the present disclosure.

FIG. 10 is a diagram illustrating a threshold voltage of memory cells, according to an embodiment of the present disclosure.

Referring to FIG. 10, in the TLC method, three bits of data may be stored in one memory cell. Therefore, the memory cells may be maintained as an erase state ER or may be programmed to any of first to seventh program states P1 to P7 according to the threshold voltage. Accordingly, the read operation of the memory cells programmed in the TLC method is also performed in the TLC method. For example, during the read operation, first to seventh read voltages Vr1 to Vr7 may be used. The first read voltage Vr1 may be a voltage for distinguishing between the erase state ER and the first to seventh program states P1 to P7, and the second read voltage Vr2 may be a voltage for distinguishing between the memory cells corresponding to the erase state ER and the first program state P1, and the memory cells corresponding to the second to seventh program states P2 to P7. The remaining third to seventh read voltages Vr3 to Vr7 may also be set as voltages for distinguishing the memory cells corresponding to different program states.

An order in which the first to seventh read voltages Vr1 to Vr7 are used may be set differently according to the memory device, and the fail bit count operation may be performed after a sensing operation of each read operation is performed.

Figure 11:
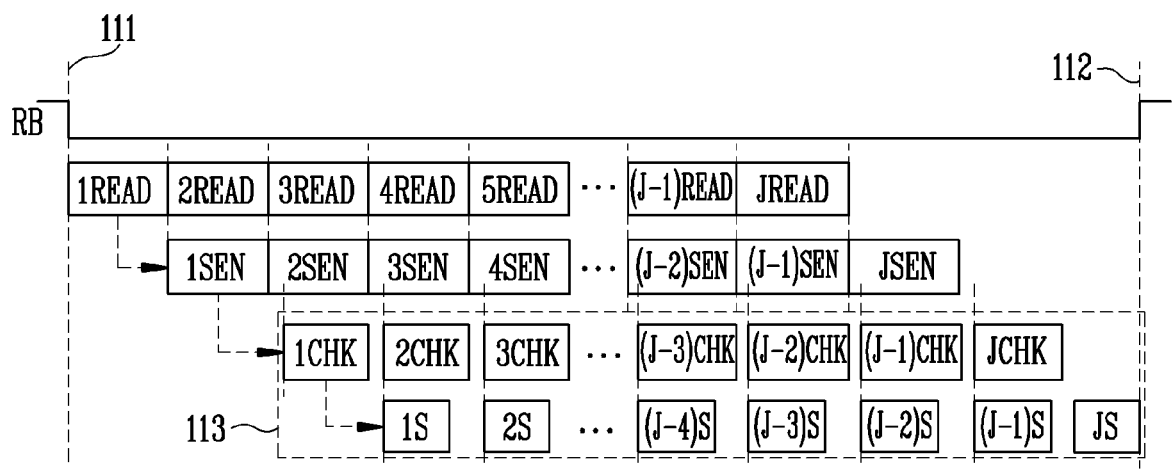
FIG. 11 is a diagram illustrating a fail bit count operation performed during a read operation according to an embodiment of the present disclosure.

FIG. 11 is a diagram illustrating a fail bit count operation performed during a read operation, according to an embodiment of the present disclosure.

Referring to FIGS. 10 and 11, when the read operation of the selected page is started, the control logic circuit 180 of FIG. 1 may output a read busy signal RB having a logic low level from a time point 111 at which a read operation 1READ is started to a time point 112 at which all fail bit counting operations 113 are completed to prevent another command from being received during the read operation.

When the number of the read voltages used in the read operation of the selected page is 3 (3 is a positive integer), first to J-th read operations 1READ-DREAD using first to J-th read voltages may be performed. Here, an order in which the first to J-th read operations 1READ-DREAD are performed may be unrelated to a level of the first to J-th read voltages. For example, according to an algorithm of the read operation, the first read voltage Vr1 may be used or the fourth read voltage Vr4 may be used in the first read operation 1READ. That is, the order of the first to J-th read operations 1READ-J READ may refer to an order in which the read operations are performed, and the read voltage used in each read operation may be different according to the algorithm set in the memory device. In the first to J-th read operations 1READ-DREAD, the read voltage may be applied to the selected word line connected to the selected page.

When the first read operation 1READ is ended, a first sensing operation 1SEN for the first read operation 1READ may be performed while a second read operation 2READ using a different read voltage is performed. In first to J-th sensing operations 1SEN-JSEN, the current or the voltage of the bit lines changed by previously performed read operations may be sensed, and the sensed data may be stored in the page buffers according to the sensed current or voltage.

When the first sensing operation 1SEN is ended, a first check operation 1CHK for checking the fail bit included in the sensed data sensed in the first sensing operation 1SEN may be performed while the third read operation 3READ is performed. The first check operation 1CHK may be performed until the first read operation 1READ is passed. For example, in the first check operation 1CHK, operations S92 to S99 described with reference to FIG. 9 may be performed. That is, operations S92 to S99 may be performed until operation S95 is passed, and when the number C # of the compensation values reaches the maximum value in operation S98, the read operation may be processed as the fail. When operation S95 is passed in the first check operation 1CHK, a first storage operation 1S of storing the number C # of the compensation values and the allowable number F # of fail bits set last in the first check operation 1CHK may be performed while the fourth read operation 4READ is performed. The number of fail bits included in the sensed data SDT may be calculated according to the allowable number F # of fail bits and the number C # of the compensation values stored when operation S95 is passed.

In the above-described method, after the first read operation 1READ is performed, the remaining second to J-th read operations 2READ-JREAD may be performed, and second to J-th sensing operations 2SEN-JSEN, second to J-th check operations 2CHK-JCHK, and the second to J-th storage operations 2S-JS for the second to J-th read operations 2READ-JREAD may be sequentially performed.

Figure 12:
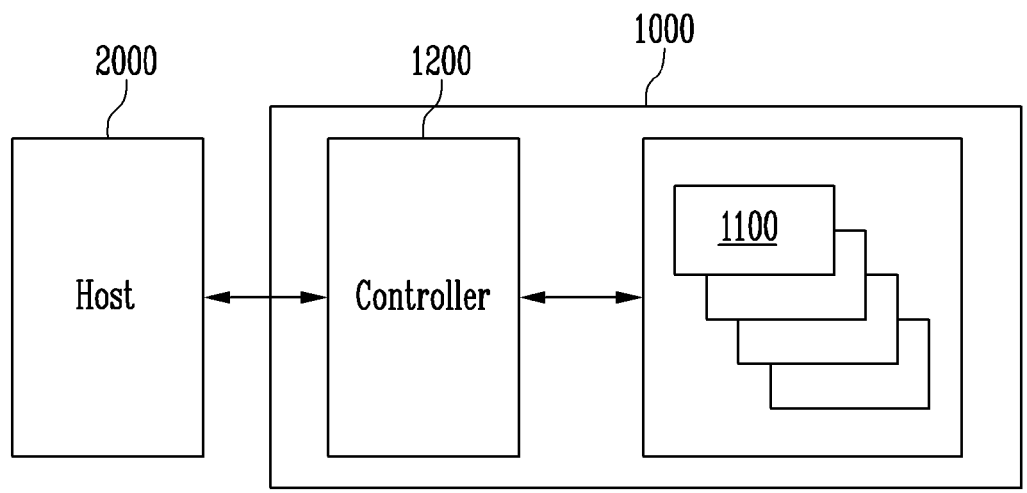
FIG. 12 is a diagram illustrating a memory system including a memory device, according to an embodiment of the present disclosure.

FIG. 12 is a diagram illustrating a memory system 1000 including a memory device, according to an embodiment of the present disclosure.

Referring to FIG. 12, the memory system 1000 may include the memory device 1100 in which data is stored, and the controller 1200 communicating between the memory device 1100 and the host 2000.

The memory system 1000 may include a plurality of memory devices 1100, and the memory devices 1100 may be connected to the controller 1200 through at least one channel. For example, a plurality of memory devices 1100 may be connected to one channel, and the plurality of memory devices 1100 may be connected to each channel even in a case where a plurality of channels are connected to the controller 1200. The memory device 1100 shown FIG. 12 may be implemented identically to the memory device 1100 shown in FIG. 1.

The controller 1200 may communicate between the host 2000 and the memory device 1100. The controller 1200 may control the memory device 1100 according to a request of the host 2000 or may perform a background operation for performance improvement of the memory system 1000 even though there is no request from the host 2000. The host 2000 may generate requests for various operations and output the generated requests to the memory system 1000. For example, the requests may include a program request that may control a program operation, a read request that may control a read operation, an erase request that may control an erase operation, and the like.

The host 2000 may communicate with the memory system 1000 through various communication standards or interfaces such as peripheral component interconnect express (PCIe), advanced technology attachment (ATA), serial ATA (SATA), parallel ATA (PATA), serial attached SCSI (SAS), non-volatile memory express (NVMe), a universal serial bus (USB), a multi-media card (MMC), an enhanced small disk interface (ESDI), or integrated drive electronics (IDE).

Figure 13:
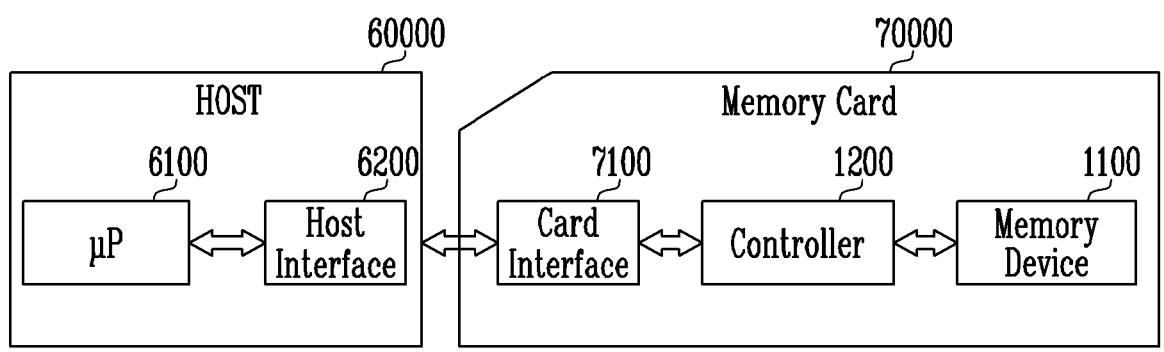
FIG. 13 is a diagram illustrating another memory system including a memory device, according to an embodiment of the present disclosure.

FIG. 13 is a diagram illustrating another memory system 70000 including a memory device, according to an embodiment of the present disclosure.

Referring to FIG. 13, the memory system 70000 may be implemented as a memory card or a smart card. The memory system 70000 may include the memory device 1100, the controller 1200, and a card interface 7100.

The controller 1200 may control data exchange between the memory device 1100 and the card interface 7100. The memory device 1100 shown in FIG. 13 may be implemented identically to the memory device 1100 shown in FIG. 1.

The card interface 7100 may be a secure digital (SD) card interface or a multi-media card (MMC) interface, but is not limited thereto.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor (μP) 6100.

While the present invention has been described with respect to the specific embodiments, it will be apparent to those skilled in the art that various changes and modifications may be made without departing from the spirit and scope of the invention as defined in the following claims. Furthermore, embodiments may be combined to form additional embodiments.

What is claimed is:

1. A memory device comprising:
   memory cells;
   page buffers configured to store sensed data obtained from the memory cells;
   a current sensing circuit configured to:
      compare a sensed voltage generated according to the sensed data received from the page buffers and a reference voltage generated according to an allowable fail bit code received from a fail bit manager, and
      output a pass signal or a fail signal to the fail bit manager according to a comparison result; and
   the fail bit manager configured to:
      increase an allowable number of fail bits included in the allowable fail bit code when the fail signal is received from the current sensing circuit,
      change the allowable fail bit code according to the allowable number of fail bits,
      provide the allowable fail bit code to the current sensing circuit, and
      determine a number of fail bits included in the sensed data based on the allowable number of fail bits when the pass signal is received from the current sensing circuit.

2. The memory device of claim 1, wherein the page buffers are connected to the memory cells through bit lines and are configured to store the sensed data according to a current or a voltage of the bit lines.

3. The memory device of claim 1, wherein the current sensing circuit comprises:
   a sensed data receiver configured to generate a compensation current according to the sensed data;
   a fail bit receiver configured to generate a reference current according to the allowable fail bit code;
   a voltage output circuit configured to output the sensed voltage according to the compensation current and generate the reference voltage according to the reference current; and
   a comparison circuit configured to compare the sensed voltage and the reference voltage and output the pass signal or the fail signal according to a result of the comparing.

4. The memory device of claim 3, wherein the sensed data receiver is further configured to increase the compensation current as the number of fail bits included in the sensed data increases.

5. The memory device of claim 3, wherein the fail bit receiver is further configured to increase the reference current as the allowable number of fail bits included in the allowable fail bit code increases.

6. The memory device of claim 3, wherein the voltage output circuit is configured to output the sensed voltage having a higher level as the compensation current increases and output the reference voltage having a higher level as the reference current increases.

7. The memory device of claim 1, wherein the fail bit manager comprises:
   a code controller configured to output a first fail count signal or a second fail count signal in response to the pass signal or the fail signal;
   a counter configured to increase or decrease the allowable number of fail bits in response to the first or second fail count signal, and output the increased or decreased allowable number of fail bits;
   a register configured to store the allowable number of fail bits output from the counter; and
   a code output circuit configured to generate and output the allowable fail bit code according to the allowable number of fail bits stored in the register.

8. The memory device of claim 7, wherein the code controller is configured to output the first fail count signal in response to the fail signal, and output the second fail count signal in response to the pass signal.

9. The memory device of claim 8, wherein the counter is configured to increase or decrease the allowable number of fail bits in response to the first fail count signal, and maintain the allowable number of fail bits, which is most recently generated, in response to the second fail count signal.

10. The memory device of claim 3, wherein the current sensing circuit further comprises a compensation circuit configured to change a slope of a reference line that determines the pass signal or the fail signal.

11. The memory device of claim 10, wherein the fail bit manager is configured to generate and output, to the current sensing circuit, a compensation code for changing the slope when the fail signal is output until the allowable number of fail bits reaches a maximum value.

12. The memory device of claim 11, wherein the fail bit manager is configured to generate and output, to the current sensing circuit, the compensation code for increasing the slope until the pass signal is output.

13. A memory device comprising:
   memory cells;
   page buffers connected to the memory cells through bit lines and configured to sense a current or a voltage of the bit lines during a read operation to store sensed data;
   a current sensing circuit configured to:
      determine whether the read operation is passed or failed according to a number of detected fail bits in the sensed data received from the page buffers and an allowable number of fail bits received from a fail bit manager,
      change a ratio of the number of the detected fail bits and the allowable number of fail bits corresponding to the number of detected fail bits, wherein the ratio is determined according to a number of compensation values received from the fail bit manager, and output a signal to the fail bit manager indicating that the read operation is passed or failed; and the fail bit manager configured to:
adjust the allowable number of fail bits when the signal indicating that the read operation is failed is received from the current sensing circuit,
adjust the number of the compensation values when it is determined that the read operation is failed until the allowable number of fail bits reaches a maximum value, and
determine the number of the detected fail bits based on the allowable number of fail bits and the number of the compensation values when the signal indicating that the read operation is passed is received from the current sensing circuit.

14. The memory device of claim 13, wherein the current sensing circuit comprises:
a compensation circuit configured to change voltages of first and second nodes according to the number of the compensation values;
a sensed data receiver configured to change a current of a third node according to the number of the detected fail bits;
a fail bit receiver configured to change a current of a fourth node according to the allowable number of fail bits;
a voltage output circuit configured to output a sensed voltage according to a current between the first and third nodes and output a reference voltage according to a current between the second and fourth nodes; and
a comparison circuit configured to compare the sensed voltage and the reference voltage and output a pass signal or a fail signal according to a result of the comparing.

15. The memory device of claim 14, wherein the compensation circuit is further configured to increase the ratio as the number of the compensation values increases.

16. The memory device of claim 14, wherein the sensed data receiver is configured to increase the current of the third node as the number of the detected fail bits in the sensed data increases.

17. The memory device of claim 14, wherein the fail bit receiver is configured to increase the current of the fourth node as the allowable number of fail bits increases.

18. The memory device of claim 14, wherein the voltage output circuit is configured to output the sensed voltage having a higher level as the voltage of the first node or the current of the third node increases.

19. The memory device of claim 14, wherein the voltage output circuit is configured to output the reference voltage having a higher level as the voltage of the second node or the current of the fourth node increases.

20. The memory device of claim 13, wherein the fail bit manager comprises:
a code controller configured to output a compensation count signal or a fail count signal in response to a pass signal or a fail signal output from the current sensing circuit;
a counter configured to change the number of the compensation values or the allowable number of fail bits in response to the compensation count signal or the fail count signal;
a register configured to store the number of the compensation values or the allowable number of fail bits changed by the counter; and
a code output circuit configured to output an allowable fail bit code or a compensation code for changing the ratio, according to the number of the compensation values or the allowable number of fail bits stored in the register.

* * * * *